United States Patent
Wu

Patent Number: 6,090,663
Date of Patent: Jul. 18, 2000

[54] METHOD FOR FORMING A HIGH-DENSITY DRAM CELL WITH A RUGGED POLYSILICON CUP-SHAPED CAPACITOR

[75] Inventor: Shye-Lin Wu, Hsinchu, Taiwan

[73] Assignee: Acer Semiconductor Manufacturing Inc., Hsinchu, Taiwan

[21] Appl. No.: 09/298,929

[22] Filed: Apr. 22, 1999

[51] Int. Cl.$^7$ .............................................. H01L 21/8242
[52] U.S. Cl. ........................ 438/253; 438/254; 438/255; 438/398
[58] Field of Search .................................. 438/253–255, 438/396–398, 238–240, 381; 257/306, 307, 309, 310

[56] References Cited

U.S. PATENT DOCUMENTS

| | | | |
|---|---|---|---|
| 5,759,888 | 6/1998 | Wang et al. | 438/253 |
| 5,930,621 | 7/1999 | Kang et al. | 438/253 |
| 5,937,294 | 8/1999 | Sandhu et al. | 438/255 |
| 5,940,701 | 8/1999 | Tseng | 438/253 |
| 6,030,866 | 2/2000 | Choi | 438/253 |

*Primary Examiner*—Donald L. Monin, Jr.
*Assistant Examiner*—Hoai Pham
*Attorney, Agent, or Firm*—Harness, Dickey & Pierce, P.L.C.

[57] ABSTRACT

In the preferred embodiment for forming a rugged polysilicon cup-shaped capacitor of a dynamic random access memory cell, a first dielectric layer is formed on a semiconductor substrate. A second dielectric layer is formed on the first dielectric layer, followed by the formation of a first conductive layer on the second dielectric layer. Portions of the first conductive layer and the second dielectric layer are then removed to define an opening therein. A second conductive layer is formed conformably on the substrate within the opening and on the first conductive layer. A sidewall structure is then formed within the opening on sidewalls of the second conductive layer. Next, a removing step is performed to remove a portion of the second conductive layer which is uncovered by the sidewall structure. The sidewall structure and a portion of the first dielectric layer are removed, using the residual second conductive layer as a mask, to define a contact hole within the first dielectric layer. A third conductive layer is formed conformably on the substrate and formed to fill up the contact hole. Portions of the first conductive layer and the third conductive layer are removed to define a storage node. The second dielectric layer is then removed and a third dielectric layer is formed on the substrate. Finally, a fourth conductive layer is formed on the third dielectric layer to complete the formation of the capacitor.

19 Claims, 6 Drawing Sheets

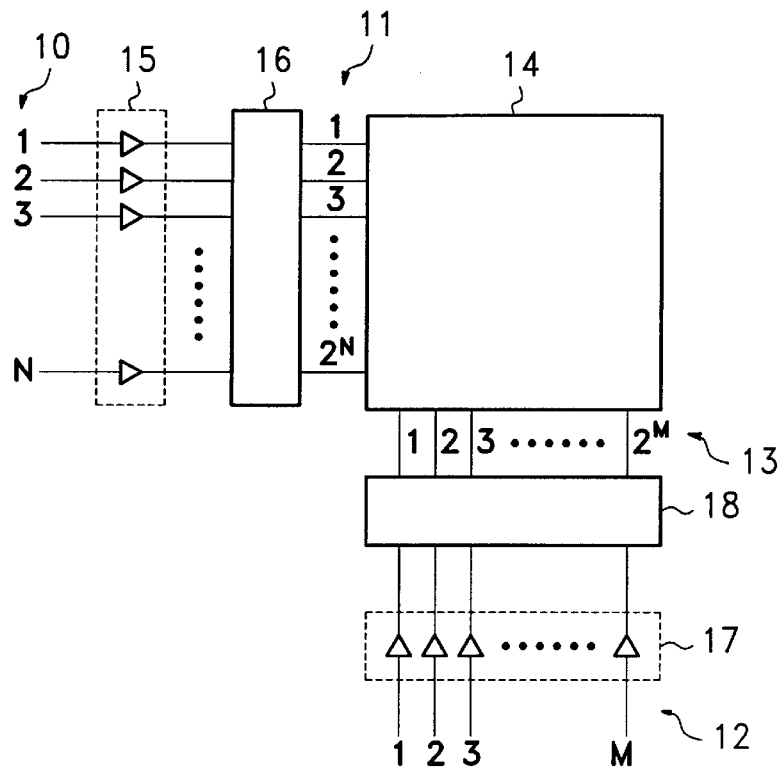
FIG.1
(Prior Art)
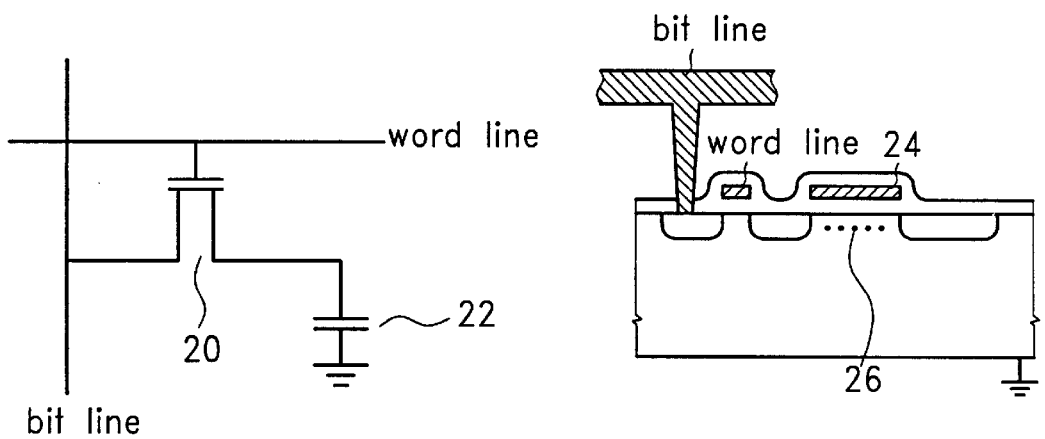
FIG.2A
(Prior Art)
FIG.2B
(Prior Art)

METHOD FOR FORMING A HIGH-DENSITY DRAM CELL WITH A RUGGED POLYSILICON CUP-SHAPED CAPACITOR

CROSS REFERENCE TO RELATED APPLICATIONS

This invention is related with an U.S. Pat. No. 5,766,995 to the same inventor as the present application under the title of "METHOD FOR FORMING A DRAM CELL WITH A RUGGED POLYSILICON CUP-SHAPED CAPACITOR".

BACKGROUND OF THE INVENTION

1. Field of the Invention

The present invention relates to dynamic random access memory (DRAM) fabrication, and more particularly, to a method for forming a rugged polysilicon cup-shaped capacitor of a dynamic random access memory cell.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flows into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor 22 voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

SUMMARY OF THE INVENTION

In accordance with the present invention, a method is provided for forming a rugged polysilicon cup-shaped capacitor of a dynamic random access memory cell that substantially increases the surface area of the capacitor. In the preferred embodiment, a first dielectric layer is formed on a semiconductor substrate. A second dielectric layer is formed on the first dielectric layer, followed by the formation of a first conductive layer on the second dielectric layer. Portions of the first conductive layer and the second dielectric layer are then removed to define an opening therein. A second conductive layer is formed conformably on the substrate within the opening and on the first conductive layer. A sidewall structure is then formed within the opening on sidewalls of the second conductive layer.

Next, a removing step is performed to remove a portion of the second conductive layer which is uncovered by the sidewall structure. The sidewall structure and a portion of the first dielectric layer are removed, using the residual second conductive layer as a mask, to define a contact hole within the first dielectric layer. A third conductive layer is formed conformably on the substrate and filled up the contact hole. Portions of the first conductive layer and the third conductive layer are removed to define a storage node. The second dielectric layer is then removed and a third dielectric layer is formed on the substrate. Finally, a fourth conductive layer is formed on the third dielectric layer to complete the formation of the capacitor.

In the preferred embodiments, the step of removing the second dielectric layer is performed with a wet etch to roughen the surface of the storage node. As an example, the storage node is roughened with hot phosphoric acid solution.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a simplified diagram illustrative of the organization of a typical large semiconductor memory;

FIG. 2A shows a circuit schematic diagram of a typical one-transistor dynamic random access memory (DRAM) cell;

FIG. 2B shows a cross-sectional view illustrative of traditional one-transistor DRAM storage cell;

DESCRIPTION OF THE PREFERRED EMBODIMENT

Figure 3:
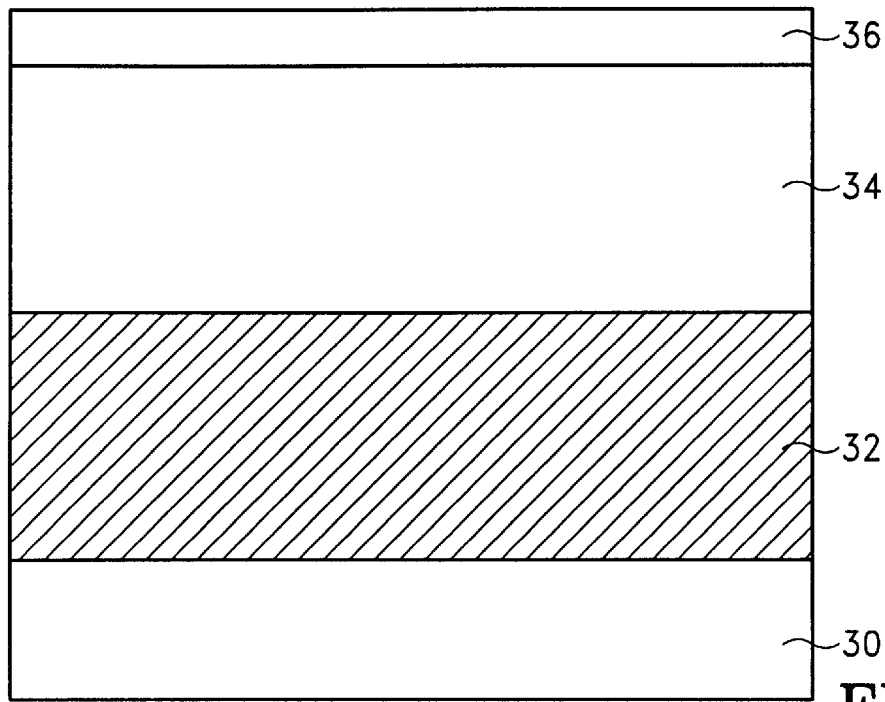
FIG. 3 shows a cross-sectional view illustrative of forming a first dielectric layer, a second dielectric layer, and a first conductive layer on a semiconductor substrate in accordance with the present invention.

Referring to FIG. 3, a semiconductor substrate 30 is provided for forming capacitors thereon. Generally, the substrate 30 has been formed with metal-oxide-semiconductor field effect transistors (MOSFETs) having gates and drain and source regions thereon. At first, a first dielectric layer 32, such as an undoped oxide layer, a doped silicon oxide layer or a boro-phosphosilicate glass (BPSG) layer, is formed on the substrate 30, in order to serve as the main insulation layer between conductive layers or conductive regions. The first dielectric layer 32 is typically deposited with a conventional low pressure chemical vapor deposition (LPCVD) or plasma enhanced chemical vapor deposition (PECVD) process. The thickness of this silicon oxide layer 32 can be ranged from about 3000 to 6000 angstroms.

After the silicon oxide layer 32 is deposited, a planarization process using any suitable conventional method such as an etch back process or a chemical mechanical polishing (CMP) process, is optionally performed to the substrate for providing better topography.

A second dielectric layer 34 is then formed on the first dielectric layer 32. In this embodiment, a silicon nitride layer is deposited using a conventional low pressure chemical vapor deposition (LPCVD) or plasma enhanced chemical vapor deposition (PECVD), to be utilized as the second dielectric layer 34. The thickness of the silicon nitride layer 126 is about 5000 to 10000 angstroms, in order to provide a recessed space for forming storage node therein and defining the main shape of the storage node.

A first conductive layer 36 is formed on the second dielectric layer 34, as shown in FIG. 3. In the preferred embodiments, the first conductive layer 36 is a doped polysilicon layer, which is formed, as an example, using a standard chemical vapor deposition process with in-situ doped n-type dopants, in order to serve as a part of the bottom electrode of the capacitor. In the preferred embodiments, the thickness of the first conductive layer 36 is between about 2000 to 10000 angstroms.

Figure 4:
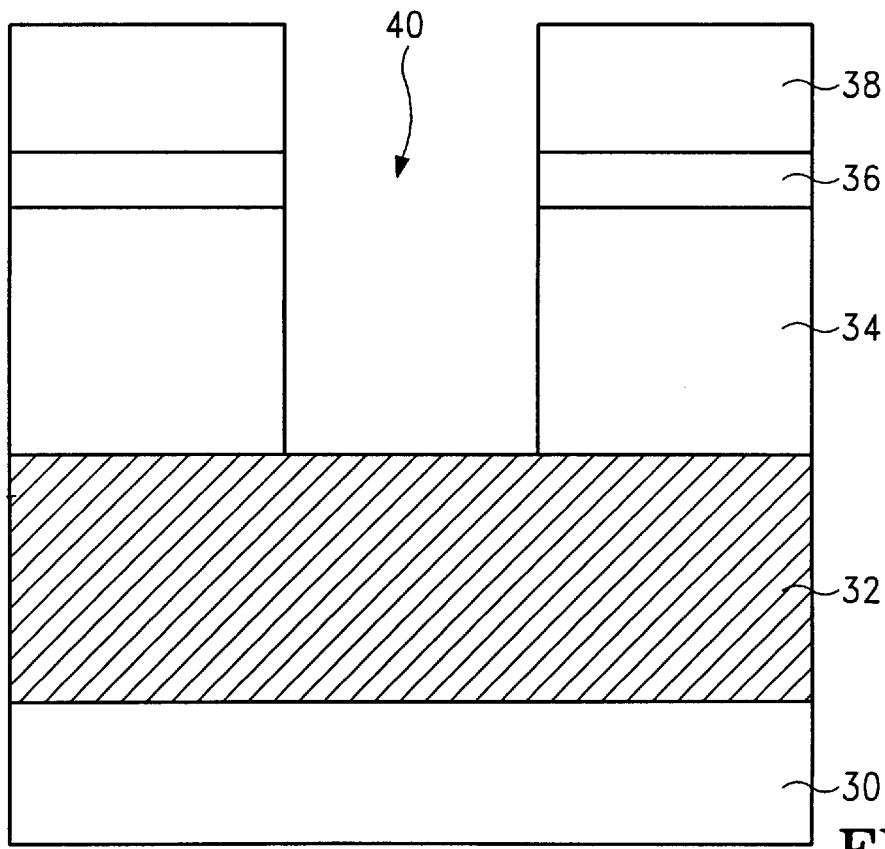
FIG. 4 shows a cross-sectional view illustrative of removing portions of the first conductive layer and the second dielectric layer to define an opening therein, in accordance with the present invention.

Turning to FIG. 4, after the first dielectric layer 32, the second dielectric layer 34 and the first conductive layer 36 is sequentially formed, portions of the first conductive layer 36 and the second dielectric layer 34 are removed to define an opening 40 therein. Conventionally, a series of steps are carried out to define the opening 40, such as lithography process to define the etch mask of a photoresist layer 38, one or more following etch steps to etch the first conductive layer 36 and the second dielectric layer 34, and a photoresist stripping process to remove the residual photoresist layer 38.

Figure 5:
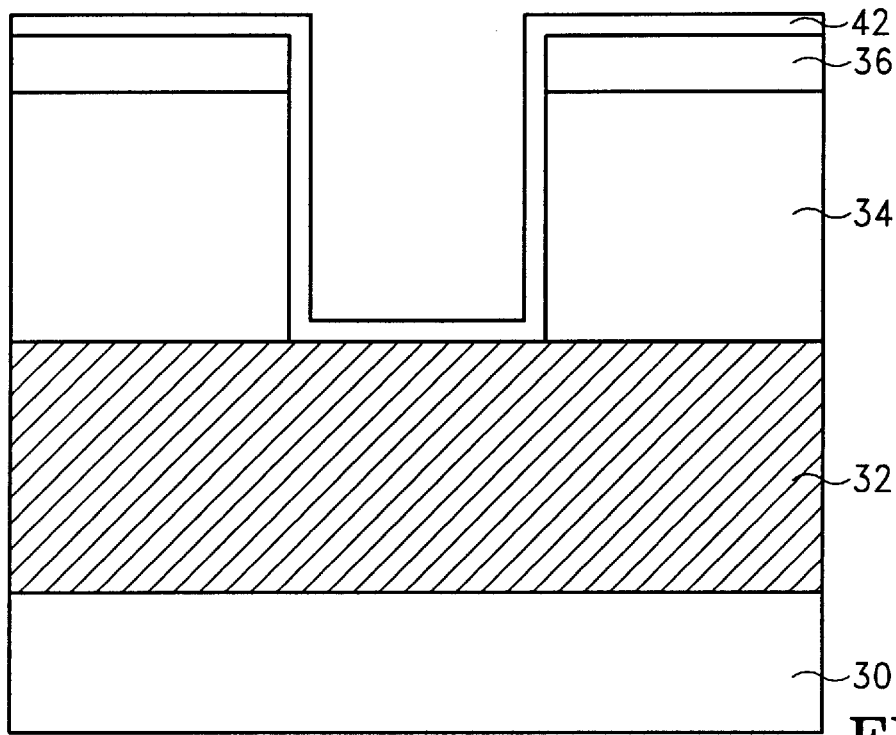
FIG. 5 shows a cross-sectional view illustrative of forming a second conductive layer conformably on the substrate within the opening and on the first conductive layer, in accordance with the present invention.

Turning to FIG. 5, a second conductive layer 42 is formed conformably on the substrate 30 within the opening 40 and on the first conductive layer 36. In the preferred embodiments, the second conductive layer 42 is a doped polysilicon layer, which is formed, as an example, using a standard chemical vapor deposition process with in-situ doped n-type dopants, in order to serve as a part of the bottom electrode of the capacitor. In the preferred embodiments, the thickness of the second conductive layer 42 is between about 200 to 2000 angstroms.

Figure 6:
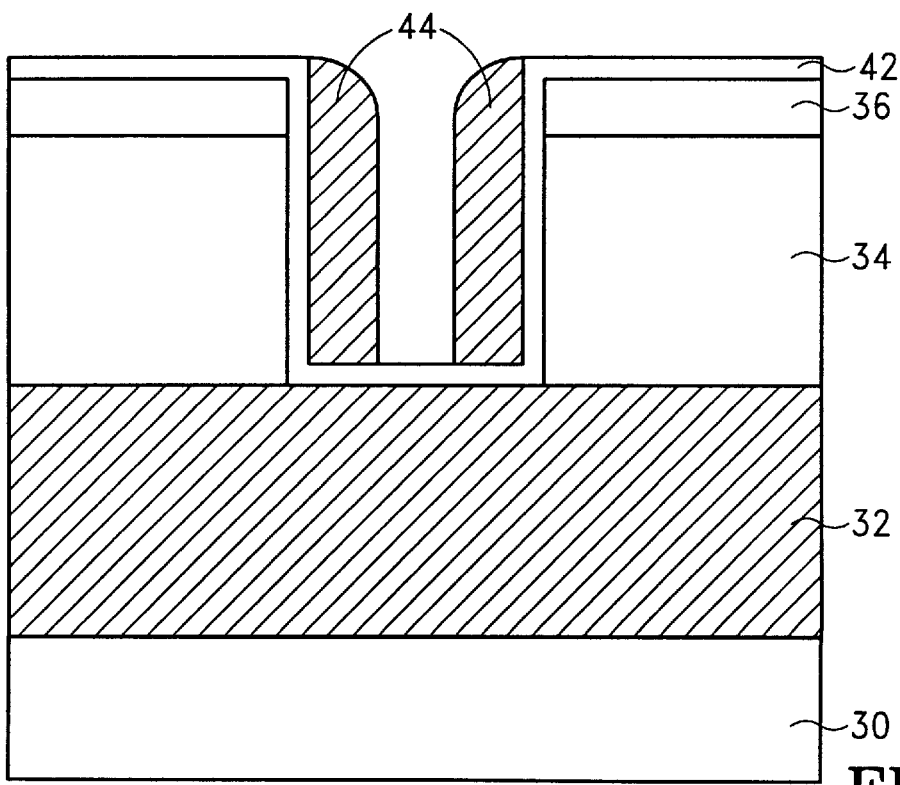
FIG. 6 shows a cross-sectional view illustrative of forming a sidewall structure within the opening on sidewalls of the second conductive layer in accordance with the present invention.

Next, a sidewall structure 44 is formed within the opening 40 on the sidewalls of the second conductive layer 42, as shown in FIG. 6. The sidewall structure 44 is employed to define the region of forming self-aligned contact holes in a later etch step. Having the sidewall structure 44, the contact hole region can be defined without utilizing a series of lithography processes, and the size of the contact holes can be defined in smaller scale without being limited to the capability of conventional lithography techniques. Silicon oxide sidewall spacers are preferably employed as the sidewall structure 44, and is typically formed by sequentially depositing and etching-back a silicon oxide layer to leave sidewall spacers on the sidewalls of the second conductive layer 42.

Figure 7:
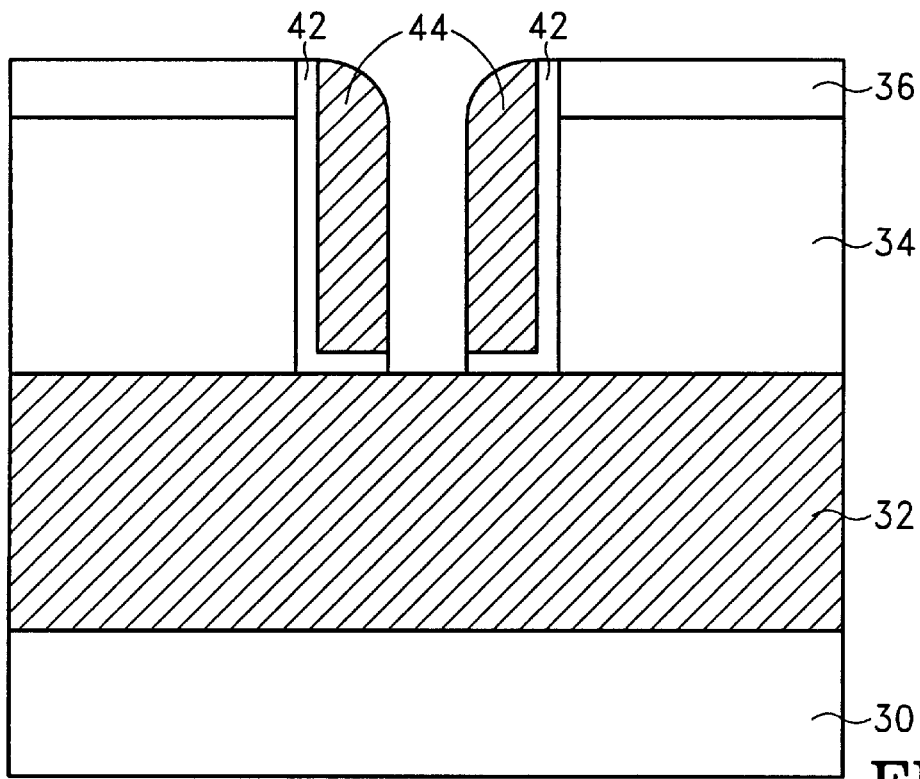
FIG. 7 shows a cross-sectional view illustrative of removing a portion of the second conductive layer which is uncovered by the sidewall structure in accordance with the present invention.

A portion of the second conductive layer 42, which is uncovered by the sidewall structure 44, is then removed as shown in FIG. 7. An etch step is preferably carried out using the sidewall structure 44 as a hard mask. Having the pattern defining sidewall structure 44, the process flow of the fabrication steps is further simplified and the process window is raised with the self-aligned etch process.

Figure 8:
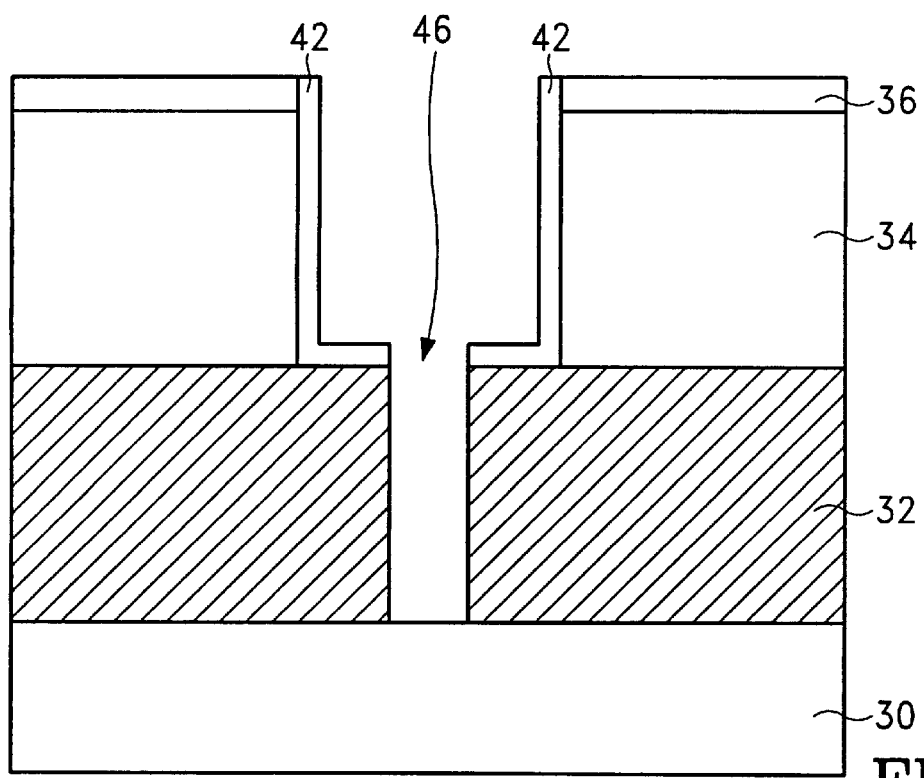
FIG. 8 shows a cross-sectional view illustrative of removing the sidewall structure and a portion of the first dielectric layer, using the residual second conductive layer as a mask, to define a contact hole within the first dielectric layer, in accordance with the present invention.

Turning to FIG. 8, the sidewall structure 44 and a portion of the first dielectric layer 32 are removed using the residual second conductive layer 42 as a mask, to define a contact hole 46 within the first dielectric layer 32. In the preferred embodiments, the contact hole 46 is extended down to a source region of a controlling transistor in the substrate 30.

Figure 9:
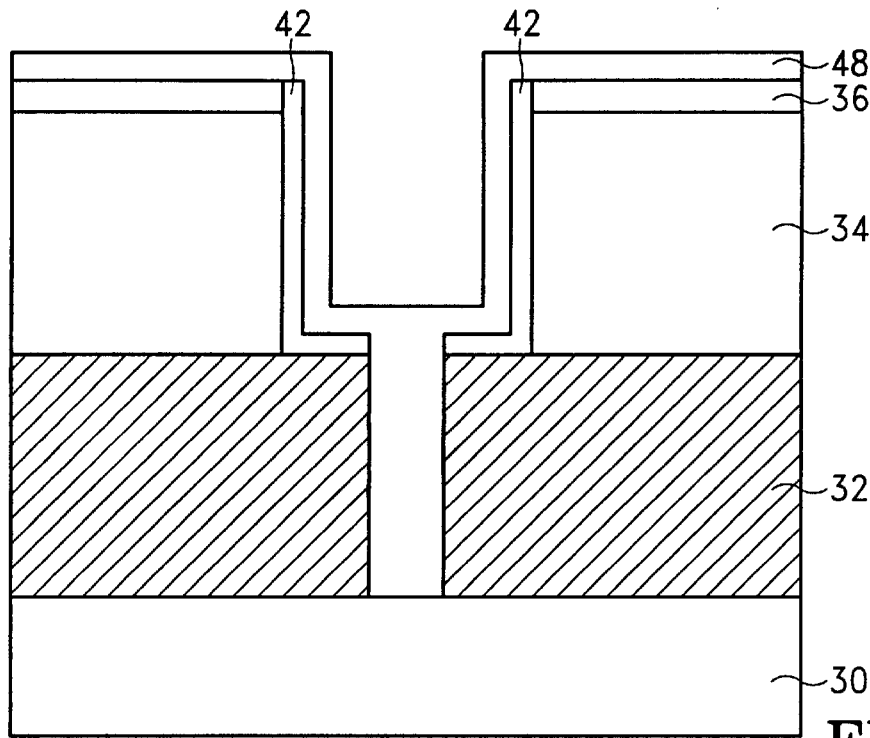
FIG. 9 shows a cross-sectional view illustrative of forming a third conductive layer conformably on the substrate and filled up the contact hole in accordance with the present invention.

Referring to FIG. 9, a third conductive layer 48 is then formed conformably on the substrate 30 and within the contact hole 46. In the case, the third conductive layer 48 is a doped polysilicon layer, which is formed, as an example, using a standard chemical vapor deposition process with in-situ doped n-type dopants, in order to serve as a part of the bottom electrode of the capacitor. In the preferred embodiments, the thickness of the third conductive layer 48 is between about 300 to 3000 angstroms.

Figure 10:
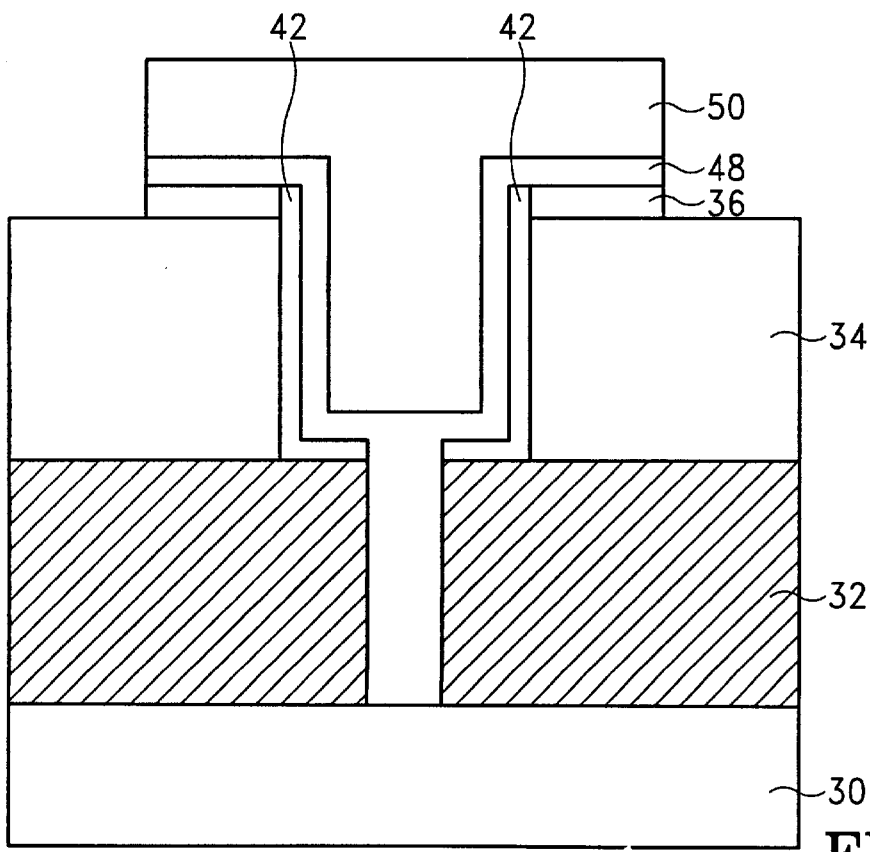
FIG. 10 shows a cross-sectional view illustrative of removing portions of the first conductive layer and the third conductive layer to define a storage node in accordance with the present invention.

Turning to FIG. 10, portions of the first conductive layer 36 and the third conductive layer 48 are removed to define a storage node. Generally, a series of steps are carried out to define the storage node, such as lithography process to define the etch mask of a photoresist layer 50, one or more following etch steps to etch the first conductive layer 36 and the third conductive layer 48, and a photoresist stripping process to remove the residual photoresist layer 50.

Figure 11:
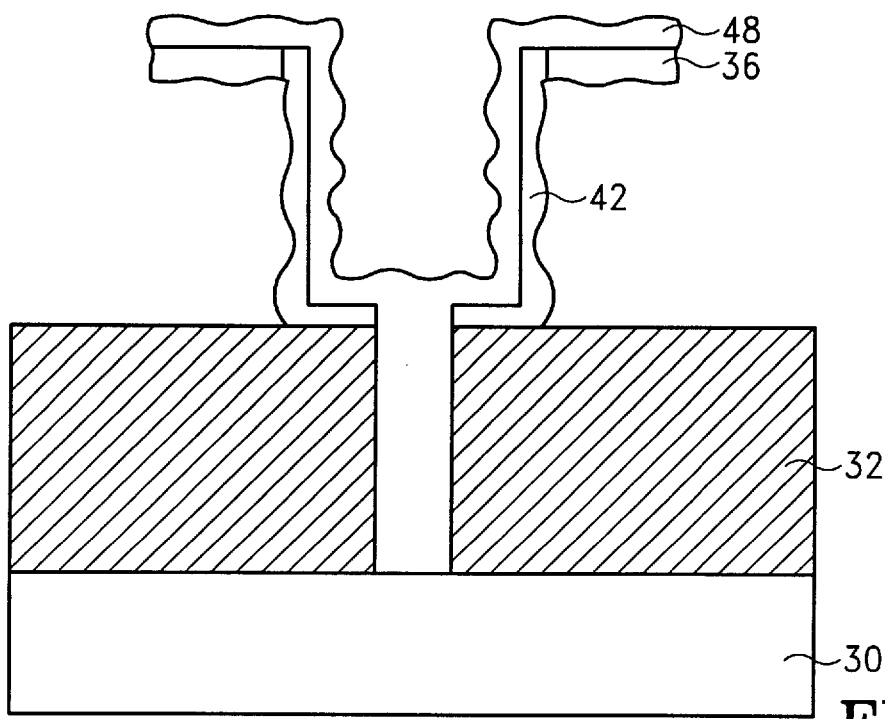
FIG. 11 shows a cross-sectional view illustrative of removing the second dielectric layer in accordance with the present invention.

Referring to FIG. 11, a step for removing the second dielectric layer 34 is then performed, as an example of employing silicon nitride as the second dielectric layer 34 in the case, a wet etch using hot phosphoric solution is carried out to remove silicon nitride, and also to remove part of the surface portion of polysilicon conductive layers 36, 42 and 48 to roughen the surface of the storage node 52 for having a rugged surface as shown in the figure. In the most preferred embodiment, the composition of the phosphoric acid solution ($H_3PO_4$) is preferably about 86+/−1% $H_3PO_4$ and 14+/−1% $H_2O$. The temperature used in the embodiment is preferably about 150–170° C., and can be ranged between about 140° C. to 180° C. in general.

Figure 12:
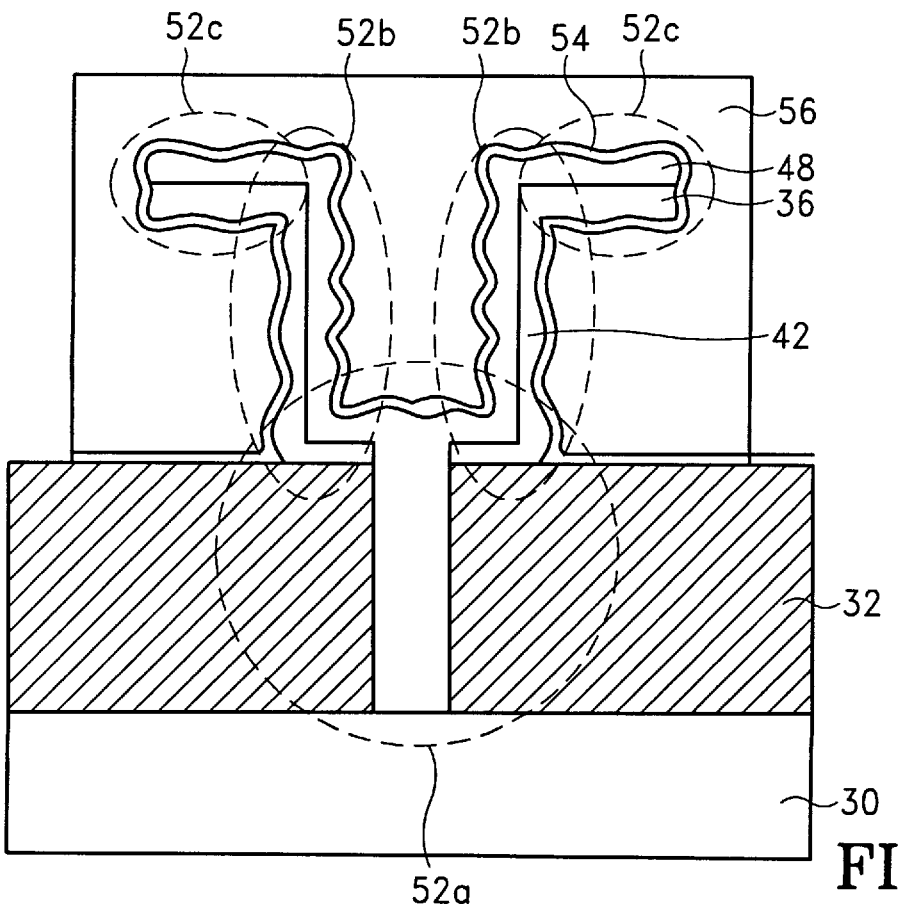
FIG. 12 shows a cross-sectional view illustrative of forming a third dielectric layer on the substrate and a fourth conductive layer to finish the capacitor structure in accordance with the present invention.

Referring to FIG. 12, a third dielectric film 54 and a fourth conductive layer 56 for the top electrode of the DRAM cell capacitor are then formed in the conventional manner. In this embodiment, a thin dielectric layer 54, such as stacked oxide-nitride-oxide (ONO) film, is formed on the exposed surface of the bottom electrode 52 and the surface of the first dielectric layer 32. As is known in the art of DRAM fabrication, the ONO film is reliable over silicon surfaces, and is typically used as a capacitor insulator. Other material, such as NO (silicon nitride-silicon oxide), $Ta_2O_5$, $TiO_2$, PZT, or BST can be used as the thin dielectric layer 54. A fourth conductive layer 56 is then deposited over the stack silicon oxide/silicon nitride/silicon oxide layer 54 to serve as an upper plate of the DRAM cell capacitor, thereby forming a dynamic random access memory cell with a rugged polysilicon cup-shaped capacitor. Typically, the second conductive layer 56 is a doped polysilicon layer formed in the same manner as the polysilicon layer 48. Other material, such as metal or silicide, can be used as the conductive layer 56.

Although specific embodiments have been illustrated and described, it will be obvious to those skilled in the art that various modifications may be made without departing from the spirit which is intended to be limited solely by the appended claims.

What is claimed is:

1. A method for forming a capacitor, said method comprising the steps of
    forming a first dielectric layer on a semiconductor substrate;
    forming a second dielectric layer on said first dielectric layer;
    forming a first conductive layer on said second dielectric layer;
    removing portions of said first conductive layer and said second dielectric layer to define an opening therein;
    forming a second conductive layer conformably on said substrate within said opening and on said first conductive layer;
    forming a sidewall structure within said opening on sidewalls of said second conductive layer;
    removing a portion of said second conductive layer which is uncovered by said sidewall structure;
    removing said sidewall structure and a portion of said first dielectric layer, using said residual second conductive layer as a mask, to define a contact hole within said first dielectric layer;
    forming a third conductive layer conformably on said substrate and filled up said contact hole;
    removing portions of said first conductive layer and said third conductive layer to define a storage node;
    removing said second dielectric layer;
    forming a third dielectric layer on said substrate; and
    forming a fourth conductive layer on said third dielectric layer.

2. The method according to claim 1, wherein said first dielectric layer comprises silicon oxide.

3. The method according to claim 1, wherein said second dielectric layer comprises silicon nitride.

4. The method according to claim 1, wherein said sidewall structure comprises silicon oxide sidewall spacers.

5. The method according to claim 1, wherein said third dielectric layer comprises a material selected from the group consisted of stacked oxide-nitride-oxide (ONO) film, NO, $Ta_2O_5$, $TiO_2$, PZT, and BST.

6. The method according to claim 1, wherein said first conductive layer comprises doped polysilicon.

7. The method according to claim 1, wherein said second conductive layer comprises doped polysilicon.

8. The method according to claim 1, wherein said third conductive layer comprises doped polysilicon.

9. The method according to claim 1, wherein the step of removing said second dielectric layer is performed with a wet etch to roughen the surface of said storage node.

10. The method according to claim 9, wherein said storage node is roughened with hot phosphoric acid solution.

11. A method for forming a capacitor, said method comprising the steps of:
    forming a first dielectric layer on a semiconductor substrate;
    forming a second dielectric layer on said first dielectric layer;
    forming a first conductive layer on said second dielectric layer;
    removing portions of said first conductive layer and said second dielectric layer to define an opening therein;
    forming a second conductive layer conformably on said substrate within said opening and on said first conductive layer;
    forming a sidewall structure within said opening on sidewalls of said second conductive layer;
    removing a portion of said second conductive layer which is uncovered by said sidewall structure;
    removing said sidewall structure and a portion of said first dielectric layer, using said residual second conductive layer as a mask, to define a contact hole within said first dielectric layer;
    forming a third conductive layer conformably on said substrate and filled up said contact hole;
    removing portions of said first conductive layer and said third conductive layer to define a storage node;
    performing a wet etch to remove said second dielectric layer and roughen the surface of said storage node;

forming a third dielectric layer on said substrate; and forming a fourth conductive layer on said third dielectric layer.

12. The method according to claim 11, wherein said first dielectric layer comprises silicon oxide.

13. The method according to claim 11, wherein said second dielectric layer comprises silicon nitride.

14. The method according to claim 11, wherein said sidewall structure comprises silicon oxide sidewall spacers.

15. The method according to claim 11, wherein said third dielectric layer comprises a material selected from the group consisted of stacked oxide-nitride-oxide (ONO) film, NO, $Ta_2O_5$, $TiO_2$, PZT, and BST.

16. The method according to claim 11, wherein said first conductive layer comprises doped polysilicon.

17. The method according to claim 11, wherein said second conductive layer comprises doped polysilicon.

18. The method according to claim 11, wherein said third conductive layer comprises doped polysilicon.

19. The method according to claim 11, wherein said storage node is roughened with hot phosphoric acid solution.

* * * * *